(12) United States Patent
Fujisawa et al.

(10) Patent No.: US 6,722,840 B2
(45) Date of Patent: Apr. 20, 2004

(54) WAFER RING SUPPLYING AND RETURNING APPARATUS

(75) Inventors: Kazuhiro Fujisawa, Nishitokyo (JP); Yoshifumi Katayama, Kitakoma-gun (JP); Yasushi Sato, Higashiyamato (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 137 days.

(21) Appl. No.: 10/141,405

(22) Filed: May 8, 2002

(65) Prior Publication Data
US 2002/0168256 A1 Nov. 14, 2002

(30) Foreign Application Priority Data
May 8, 2001 (JP) .......................... 2001-137878

(51) Int. Cl.[7] .................. H01L 21/68; H01L 21/52; B65G 49/07
(52) U.S. Cl. .................. 414/416.01; 414/941
(58) Field of Search .............. 414/416.01, 941

(56) References Cited

U.S. PATENT DOCUMENTS 6,062,795 A  5/2000  Fuke et al.

FOREIGN PATENT DOCUMENTS

JP  2000-277545  10/2000

*Primary Examiner*—Steven A. Bratlie
(74) *Attorney, Agent, or Firm*—Koda & Androlia

(57) ABSTRACT

A wafer ring supplying and returning apparatus including a magazine that accommodates wafer rings, a jig holder that holds the wafer rings, a drier that causes contraction of the wafer sheets on used wafer rings, and a wafer chucking member that chucks and conveys the wafer rings, and the apparatus further including buffer sections having two (upper and lower) wafer supporting grooves that support wafer rings and a wafer pushing member disposed on or below the wafer chucking member so as to push the wafer rings. The wafer chucking member is disposed so as to face one of the wafer supporting grooves of the buffer sections, and the wafer pushing member is disposed so as to face another one of the wafer supporting grooves.

1 Claim, 10 Drawing Sheets

WAFER RING SUPPLYING AND RETURNING APPARATUS

BACKGROUND OF THE INVENTION

1. Field of the Invention

The present invention relates to a wafer ring supplying and returning apparatus.

2. Prior Art

The wafer ring supplying and returning apparatus in a die bonding apparatus is generally equipped with a magazine that accommodates wafer rings at a fixed pitch, an elevator that moves the magazine up and down, and a wafer ring conveying means. The wafer ring conveying means conveys wafer rings accommodated in the magazine one at a time and supplies the wafer rings to a jig holder, and it also returns used wafer rings from which the dies have been picked up to empty accommodating sections in the magazine.

A wafer sheet is, at its outer circumferential portion, attached to each of the wafer rings, and a wafer that has been split longitudinally and laterally into dies is pasted to the wafer sheet.

The wafer rings that are supplied to the jig holder are stretched by a stretching device so as to enlarge the spacing between the dies. As a result, the wafer sheets on the used wafer rings are in a slack state. If such used wafer rings are returned to the magazine "as is", these used wafer rings will interfere with the adjacent wafer rings above or below that are accommodated in the magazine. Accordingly, before these used wafer rings are returned to the magazine, a warm air draft is blown onto the wafer sheets so that the wafer sheets are caused to contract.

Thus, since the used wafer rings are returned to the magazine after a warm air draft is blown onto the wafer sheets so as to contract, and the next wafer sheet is then removed from the magazine, it is time consuming.

In order to solve this problem, in the die bonding apparatus disclosed in, for example, in Japanese Patent Application Laid-Open (Kokai) No. 2000-277545, the working efficiency of die bonding is improved by performing an operation that causes the wafer sheets on the used wafer rings to contract during the die bonding operation.

In order to cause contraction of the wafer sheets on the used wafer rings, this prior art bonding apparatus includes, a hot-plate upper waiting section, a lower wafer waiting section, and a lower X-axis slider mechanism. The hot-plate upper waiting section is disposed above the side of a magazine so as to be raised and lowered by an upper waiting location raising-and-lowering part. The lower wafer waiting section is disposed on the front side of the magazine in a position that is lower than the height at which the wafer rings are removed from the magazine. The lower X-axis slider mechanism causes a lower X-axis hand that returns the wafer rings in this lower wafer waiting section to the magazine to move in the direction of the X axis. Since a large number of constituting mechanical elements are required, the apparatus is complicated and expensive, and the size of the apparatus tends to be large.

In operation of this apparatus, the wafer rings are held by an upper X-axis hand and removed from the jig holder, after which the wafer rings are caused to wait in the hot plate upper waiting section. The hot plate upper waiting section is next lowered so that the wafer ring is placed on the hot plate, and the magazine is lowered and the hot plate is stopped at the height of the lower wafer waiting section. Then, the magazine is raised so that the original accommodating section, which is empty, is set at the height of the lower wafer waiting section. Lastly, the wafer ring whose wafer sheet has been caused to contract by the application of heat from the hot plate is accommodated in the specified accommodating section of the magazine by the lower X-axis hand. Thus, an extremely large number of operations are required; and as a result, the control system is complicated.

SUMMARY OF THE INVENTION

Accordingly, the object of the present invention is to provide a wafer ring supplying and returning apparatus that causes contraction of the wafer sheets of the used wafer rings during the bonding performed by the die bonding apparatus and simplifies the apparatus and the control system, thus lowering the cost and reducing the size of the apparatus.

The above object is accomplished by a unique structure for a wafer ring supplying and returning apparatus that comprises:

a magazine which is carried on an elevator and raised and lowered, the magazine accommodating wafer rings at a fixed pitch, a jig holder which holds the wafer rings and being moved between a wafer ring exchange position in front of the magazine and a die pick-up position, a drier which is disposed near a front of the magazine, the dryer blowing a hot air draft upward, a buffer mechanism which has buffer sections in which two (upper and lower) wafer supporting grooves that support the wafer rings are formed vertically, the buffer mechanism being caused to move to above and to a front of the magazine, and a wafer transfer mechanism which includes a wafer chucking member and a wafer pushing member, the wafer chucking member being disposed in a position corresponding to one of the upper and lower wafer supporting grooves and chucking and conveying the wafer rings, and the wafer pushing member being disposed in a position corresponding to another one of the upper and lower wafer supporting grooves and pushing the wafer rings; and in this wafer ring supplying and returning apparatus when the jig holder has moved to the die pick-up position, an unused wafer ring inside the magazine is chucked by the wafer chucking member, removed from the magazine and supported in one of the upper and lower wafer supporting grooves of the buffer sections, when the jig holder has moved to the wafer ring exchange position, a used wafer ring held in the jig holder is pushed by the wafer pushing member and supported in another one of the upper and lower wafer supporting grooves of the buffer sections, and the unused wafer ring inside the buffer sections is chucked by the wafer chucking member and held in the jig holder, and when the jig holder has again moved to the die pick-up position, the buffer sections are moved to a point above the drier, and then the wafer chucking member chucks the used wafer ring inside the buffer sections and accommodates the used wafer ring in an empty accommodating section of the magazine.

DETAILED DESCRIPTION OF THE INVENTION

Figure 1:
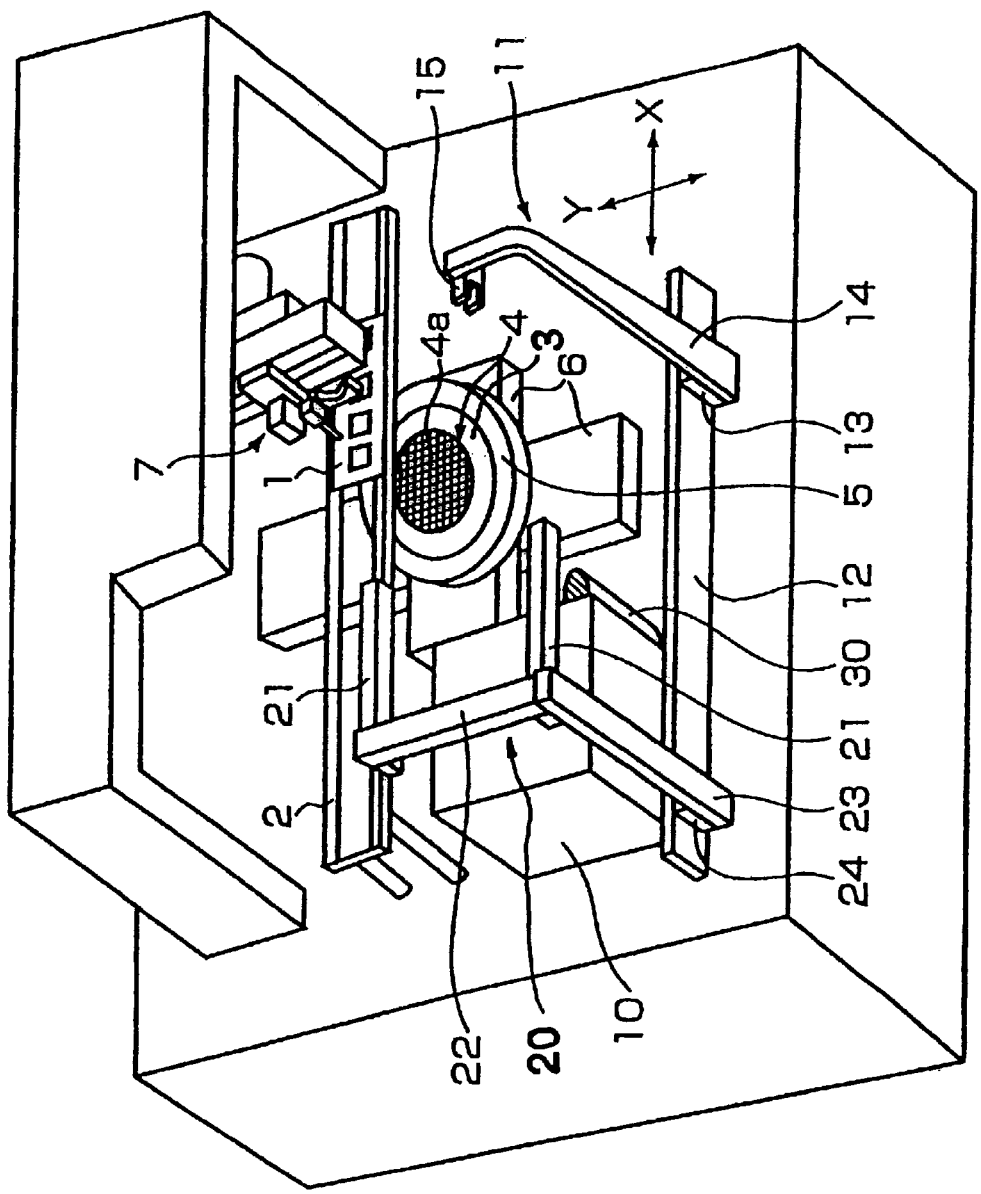
FIG. 1 is an explanatory perspective view of one embodiment of the wafer ring supplying and returning apparatus of the present invention.

As shown in FIG. 1, a lead frame 1 is guided by guide rails 2 and is intermittently fed by a frame feeder (not shown).

The outer circumferential portion of a wafer sheet is pasted to a wafer ring 3, and a wafer 4 that has been split longitudinally and laterally into dies 4a is pasted to this wafer sheet. The wafer ring 3 is positioned and fastened in place in a jig holder 5, and this jig holder 5 is movable in the directions of the X and Y axes (or moved horizontally) by an XY table 6. The jig holder 5 is also raised and lowered by a vertical driving means (not shown).

The dies 4a are picked up one at a time by a bonding apparatus 7 and bonded to the lead frame 1. The structure above belongs to prior art, and a further description will be omitted. The lead frame 1 may be a substrate, tape, etc.

A magazine 10 is provided so as to be raised and lowered by an elevator (not shown), and wafer rings 3 are accommodated in the magazine 10 in a configuration in which the wafer rings 3 are stacked at a specified pitch.

A wafer transfer mechanism 11 is provided so as to remove the wafer rings 3 from the inside of the magazine 10 and returning the wafer rings 3 to the magazine 10. In this wafer transfer mechanism 11, a slider 13 is fitted in a guide rail 12 that extend in the direction of the X axis so that this slider 13 is free to slide; and a transfer arm 14 is fastened to this slider 13. The transfer arm 14 is moved along the guide rail 12 by a transfer driving means (not shown). A wafer chucking member 15 that chucks the wafer rings 3 is provided on the transfer arm 4. Though not shown, a groove is formed in the jig holder 5 so that the wafer chucking member 15 can pass through the jig holder 5 while chucking a wafer ring 3.

The magazine 10, the elevator that raises and lowers the magazine 10, and the wafer transfer mechanism 11 have structures that are more or less similar to those in, for example, U.S. Pat. No. 6,062,795. The elevator and wafer transfer mechanism 11 operate, however, differently in the present invention as will be described later.

Above the magazine 10, a buffer mechanism 20 is provided. As seen from FIG. 2, the buffer mechanism 20 is comprised of a pair of buffer sections 21 and a connecting member 22. The buffer sections 21 extend in the direction of the X axis and face each other, and the connecting member 22 is fastened to the upper surfaces of the buffer sections 21. Two wafer supporting grooves (upper and lower wafer supporting grooves) 21a and 21b that support both side edge portions of a wafer ring are formed parallel to each other in each of the facing surfaces of the buffer sections 21. The connecting member 22 is fastened to the upper end of a supporting arm 23 of the buffer mechanism 20. The supporting arm 23 is fastened, at its lower end, to a slider 24 which is inserted in the guide rail 12 so that the slider 24 can slide on the guide rail 12. The supporting arm 23 is moved along the guide rail 12 by a buffer driving means (not shown).

Figure 2:
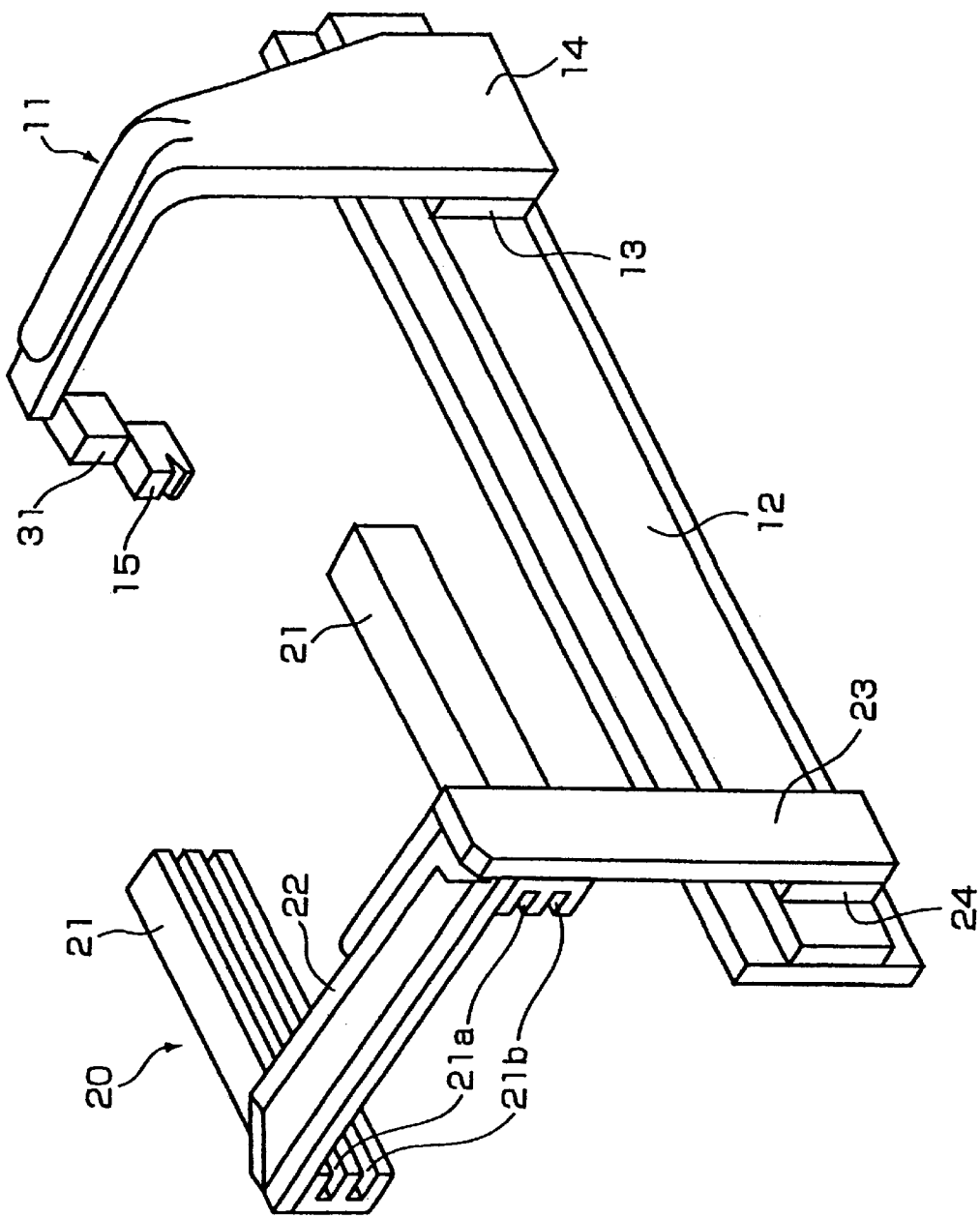
FIG. 2 is an explanatory perspective view of the wafer transfer mechanism and buffer mechanism used in the wafer ring supplying and returning apparatus.

As shown in FIG. 1, a drier 30 that blows a warm air draft upward is disposed near the front of the magazine 10. Furthermore, as shown in FIG. 2, a wafer pushing member 31 which pushes the wafer ring 3 is disposed on the upper part of the wafer chucking member 15 of the wafer transfer mechanism 11.

Next, the operation of the above embodiment will be described with reference to FIGS. 3A through 5H and to the flow charts of FIGS. 6 and 7.

In the processes shown in FIGS. 3A through 3H, wafer rings 3 (3A, 3B . . . ) inside the magazine 10 are moved one at a time to the lower wafer supporting grooves 21b of the buffer sections 21. These processes are performed simultaneously with the bonding operation when the jig holder 5 has moved to the die pick-up position and a wafer ring 3 is held in this jig holder 5.

Figure 3A:
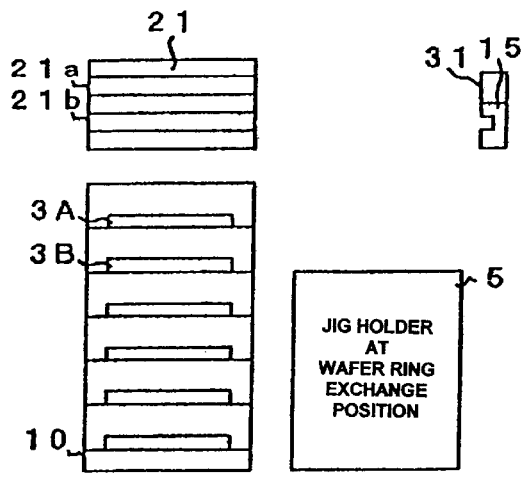
FIGS. 3A through 3H show the steps of operation of the wafer ring supplying and returning apparatus.

FIG. 3A shows that the apparatus is just started, and the initial wafer ring 3A is going to be removed from the magazine 10. The jig holder 5 has moved to a wafer ring exchange position in front of the magazine 10 by way of driving the XY table 6 (step S1, see FIG. 6).

Figure 3B:
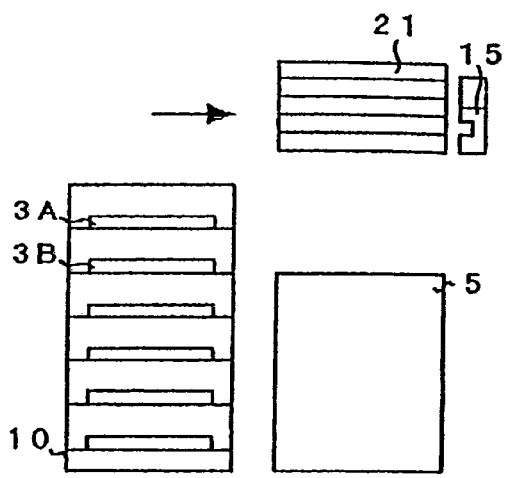

Next, as shown in FIG. 3B, the buffer sections 21 are moved to the right (or toward the wafer chucking member 15) (step S2).

Figure 3C:
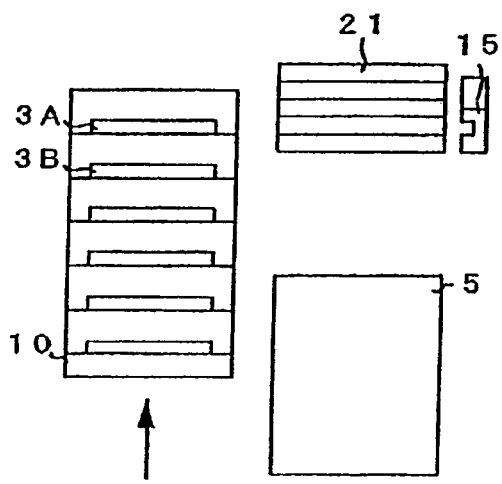

Then, in step shown in FIG. 3C, the magazine 10 is raised so that the uppermost wafer ring 3A inside the magazine 10 is raised to a height that corresponds to the wafer chucking member 15 (step S3).

Figure 3D:
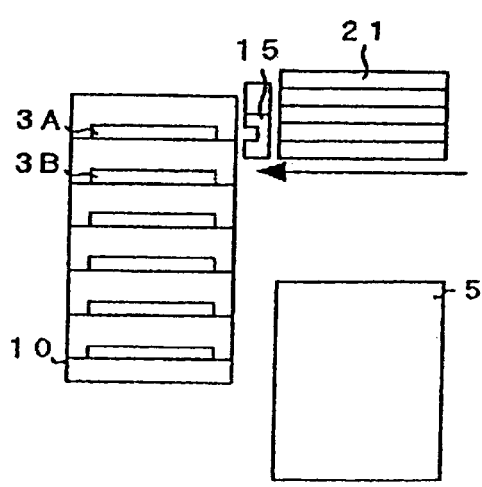

Furthermore, as seen in FIG. 3D, the wafer chucking member 15 is moved to the left (or toward the magazine 10) so that the wafer chucking member 15 is positioned in front of the magazine 10 (step S4).

Figure 3E:
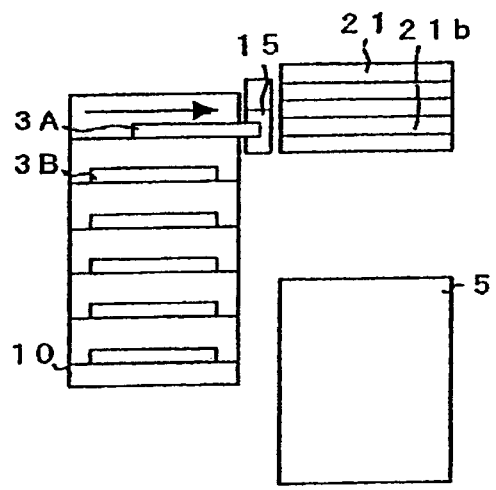

Next, as shown in FIG. 3E, a pusher (not shown) which is disposed behind the magazine 10 is actuated so as to push the wafer ring 3A, and the wafer chucking member 15 chucks this wafer ring 3A (step S5).

Figure 3F:
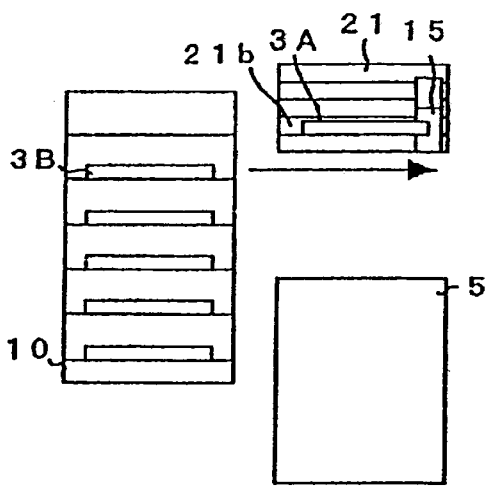

Then, in step of FIG. 3F, the wafer chucking member 15 is moved to the right (or in the opposite direction from the magazine 10), thus removing the wafer ring 3A form the magazine 10 and positioning both side edge portions of the wafer ring 3A in the lower wafer supporting grooves 21b (step S6). The reference numeral 10a indicates the accommodating section for the wafer ring 3A.

Figure 3G:
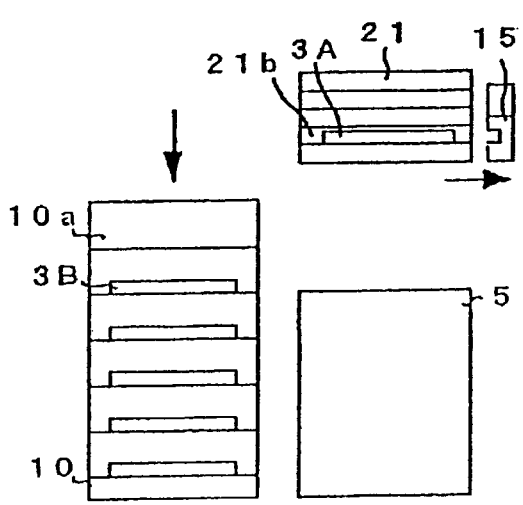

Next, as shown in FIG. 3G, the wafer chucking member 15 opens and releases the wafer ring 3A, so that the wafer ring 3A is carried in the lower wafer supporting grooves 21b. Then, the wafer chucking member 15 is moved to the retracted position (toward the right) (step S7), and the magazine 10 is lowered (step S8).

Figure 3H:
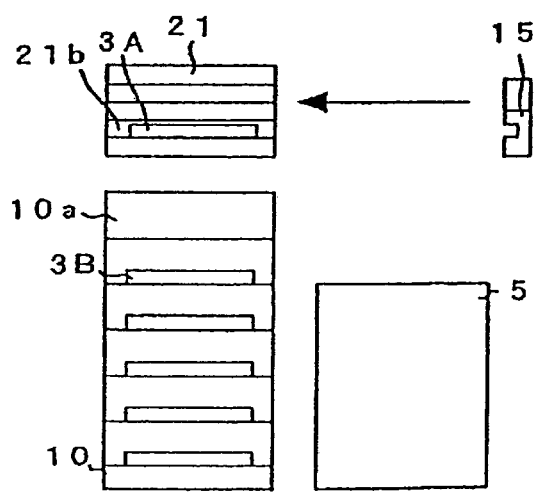

In step shown in FIG. 3H, the buffer sections 21 are moved to the left (or toward the buffer sections 21) so that the buffer sections 21 are positioned above the magazine 10 (step S9).

Figure 4A:
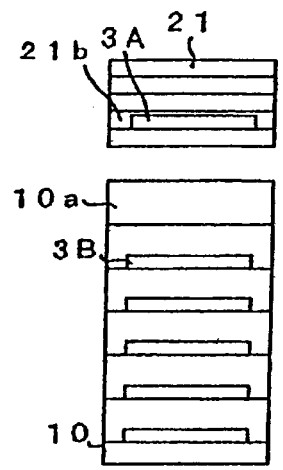
FIGS. 4A through 4H show the steps of operation of the wafer ring supplying and returning apparatus, these steps being a continuation of the step of FIG. 3H.

Next, a judgement is made as to whether or not a wafer ring 3 (3A, 3B . . . ) is set in the jig holder 5 (step S10). In the case of FIG. 3H, no wafer ring 3 is set in the jig holder 5; accordingly, the jig holder 5 is, as shown in FIG. 4A, raised to the supply height of the wafer ring 3A (step S11).

Figure 4B:
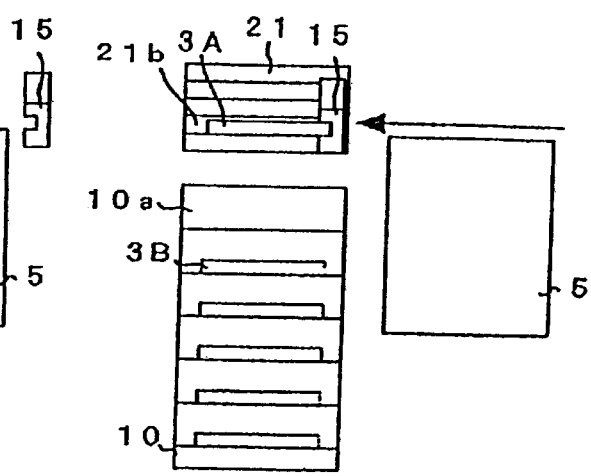

Then, as shown in FIG. 4B, the wafer chucking member 15 is moved to the left toward the buffer sections 21 and chucks the wafer ring 3A (step S12).

Figure 4C:
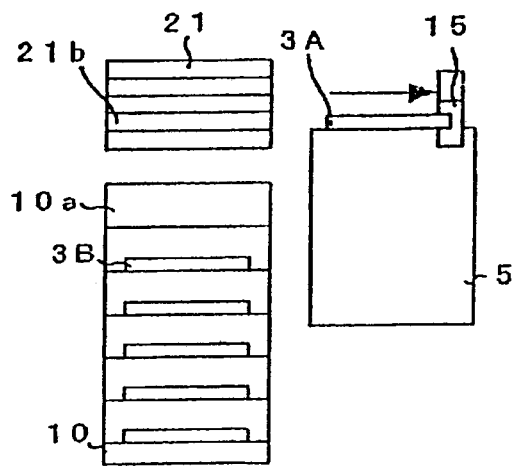
Figure 4D:
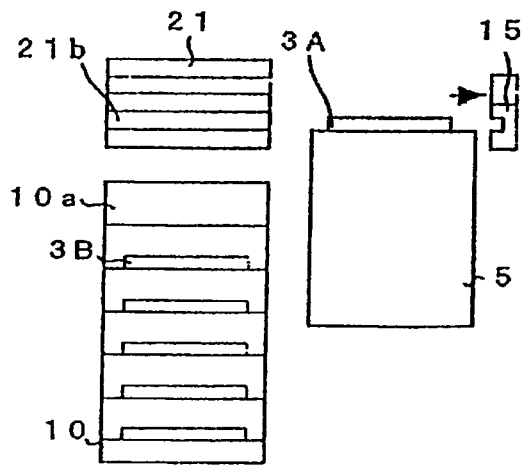

Next, as shown in FIG. 4C, the wafer chucking member 15 is moved to the right (or in the opposite direction from the buffer sections 21) (step S13). When the wafer ring 3A is moved by the wafer chucking member 15 to a specified position in the jig holder 5, the wafer chucking member 15 opens, and the wafer chucking member 15 is moved to the retracted position (step S14). As a result, the wafer ring 3A is placed in the jig holder 5 as shown in FIG. 4D.

Figure 4E:
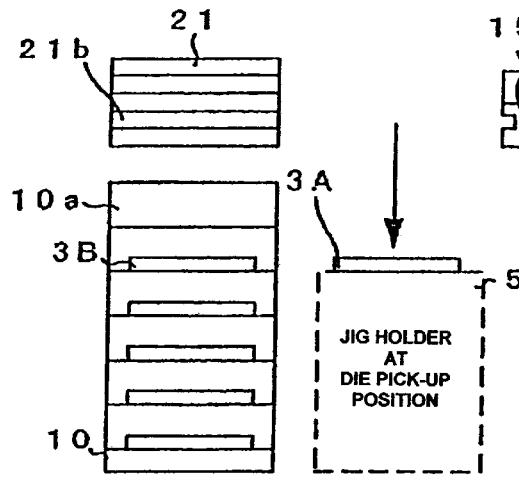

Then, as seen from FIG. 4E, the jig holder 5 is lowered, and the wafer ring 3A is stretched and positioned by a stretching device (not shown) of the jig holder 5. Then, the XY table 6 shown in FIG. 1 is driven so that the jig holder 5 is moved to the die pick-up position (step S15).

Next, the dies 4a on the wafer ring 3A are picked up one at a time by the bonding apparatus 7 and are bonded to the lead frame 1 (step S16).

During this bonding operation, a judgement is made as to whether or not wafer rings 3 are present in the magazine 10 and as to whether or not a wafer ring 3 is yet to be supplied to the buffer sections 21 (step S17). In the case of FIG. 4E, there is no wafer ring 3 in the buffer sections 21; accordingly, the processing shifts to the step S2. In other words, by the processes shown in FIGS. 3B through 3H, the next wafer ring 3B is placed in the lower wafer supporting grooves 21b as shown in FIG. 4F.

Figure 6:
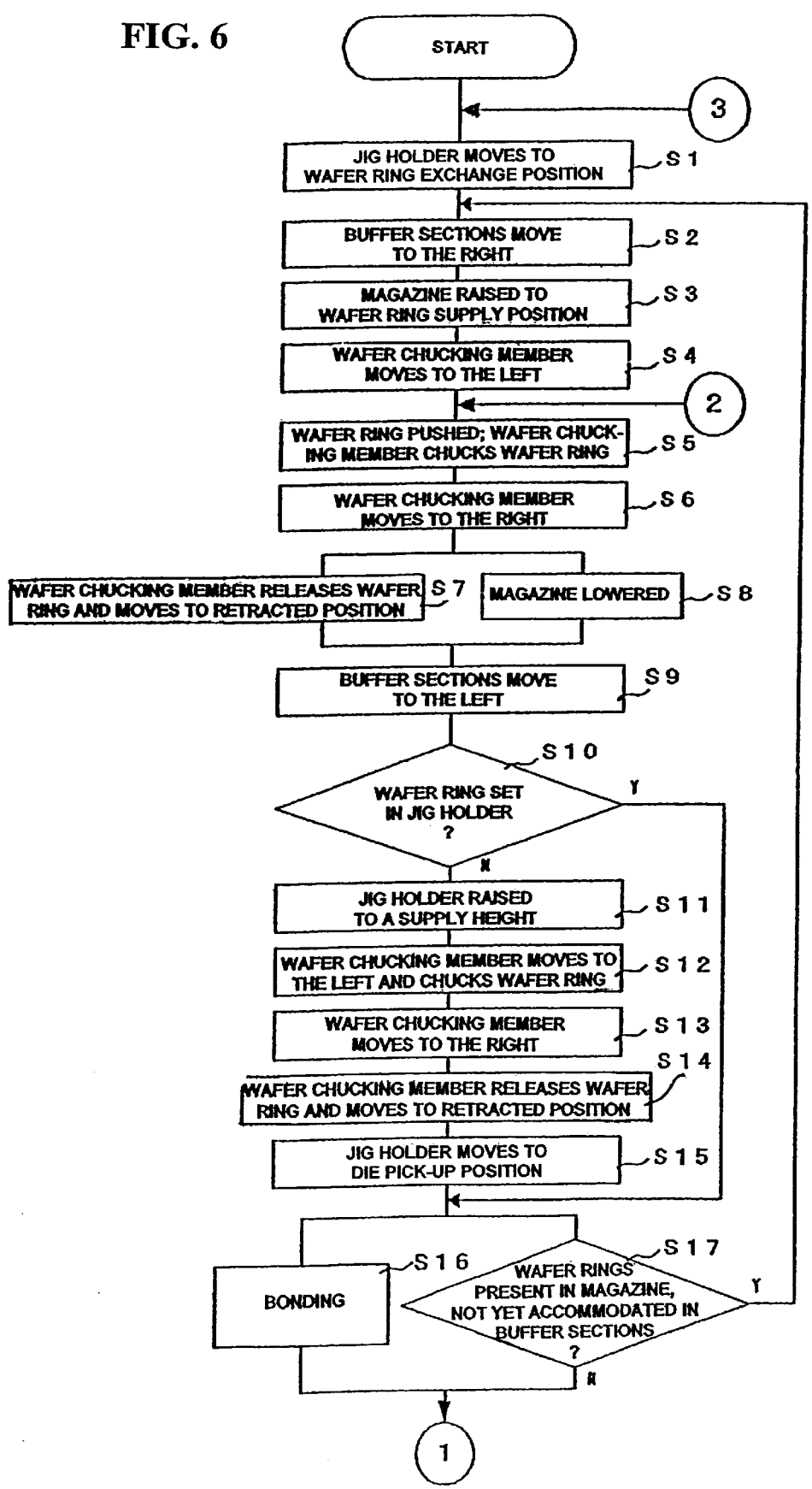
FIG. 6 is a flow chart of the operation of the wafer ring supplying and returning apparatus.
Figure 7:
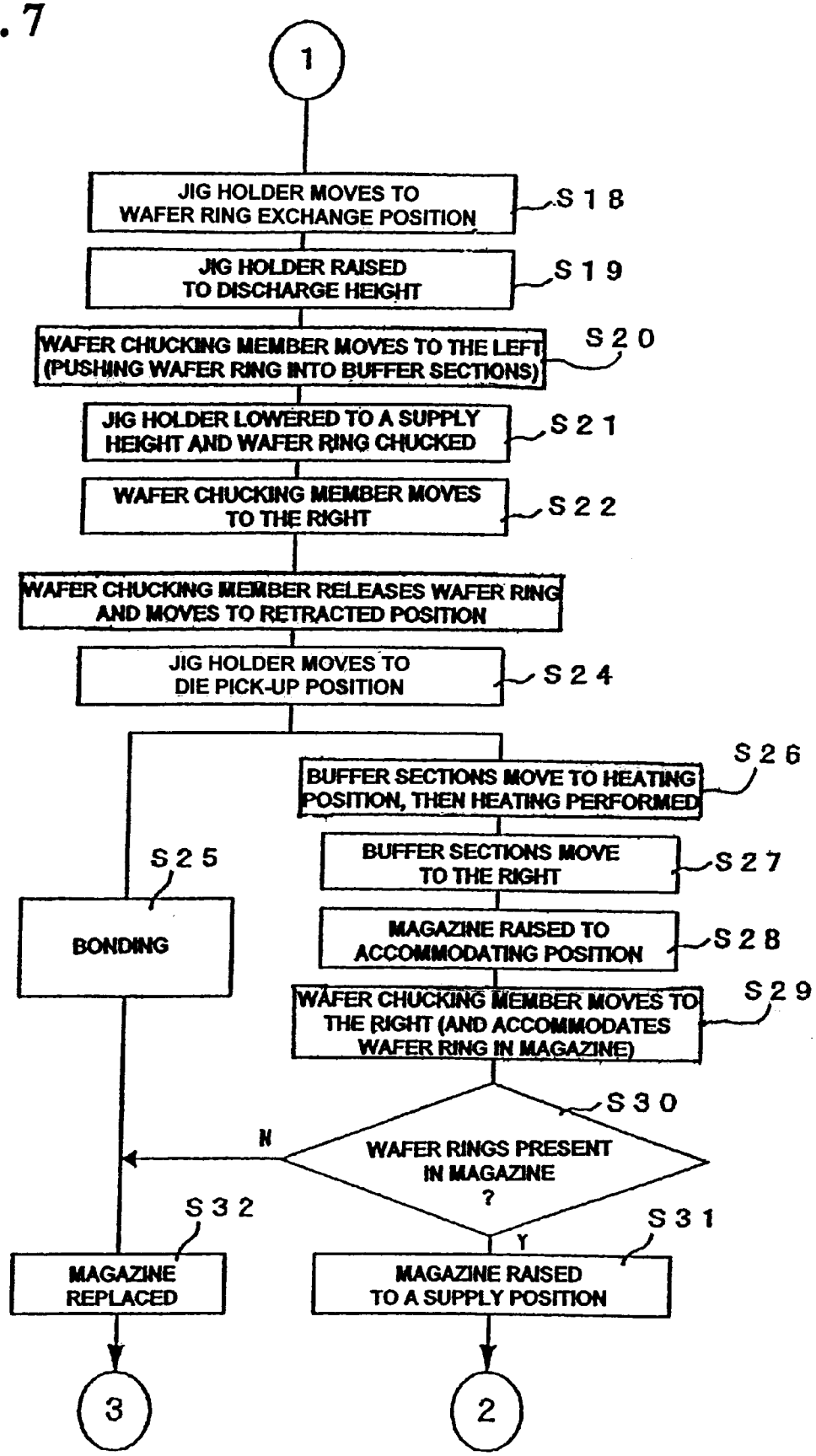
FIG. 7 is a flow chart that is a continuation of FIG. 6.

When the good dies 4a on the wafer ring 3A have all been picked up, and the wafer ring 3B has been supplied to the buffer sections 21, the XY table 6 is driven so that the jig holder 5 is moved to the wafer ring exchange position in front of the magazine 10 (step S18) (The continuation from steps S16 and S17 in FIG. 6 to step S18 in FIG. 7 is shown by ① in FIG. 6 and ① in FIG. 7).

Figure 4F:
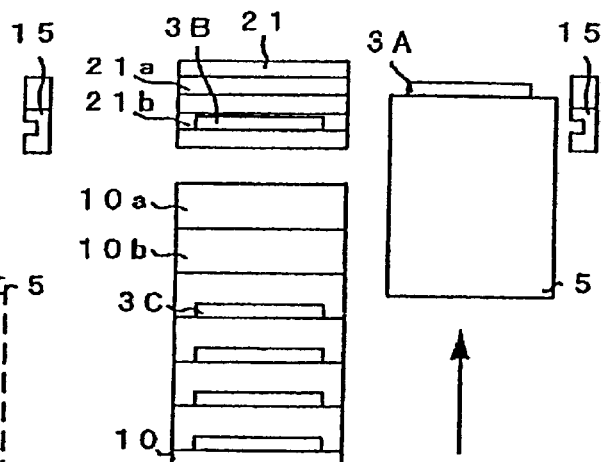

Next, as shown in FIG. 4F, the jig holder 5 is raised to the discharge height that corresponds to the upper wafer supporting grooves 21a of the buffer sections 21 (step S19).

Figure 4G:
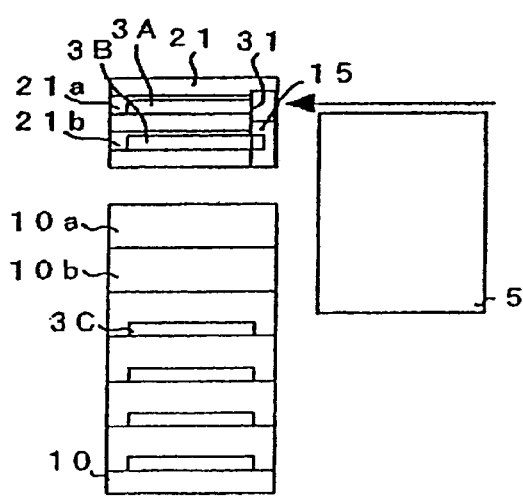

Then, as shown in FIG. 4G, the wafer chucking member 15 is moved to the left (or toward the butter sections 21) and positioned in front of the buffer sections 21 (step S20). As a result, the used wafer ring 3A (a wafer ring from which dies have been removed or picked up) on the jig holder 5 is pushed by the wafer pushing member 31 provided above the wafer chucking member 15, and the used wafer ring 3A is placed in the upper wafer supporting grooves 21a. In addition, the wafer chucking member 15 faces the wafer ring 3B.

Figure 4H:
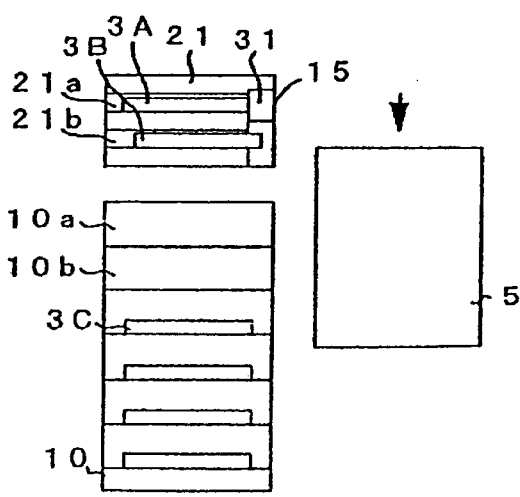

Next, as shown in FIG. 4H, the jig holder 5 is lowered to the height at which the wafer ring 3B is supplied, and the wafer chucking member 15 chucks the wafer ring 3B (step S21).

Figure 5A:
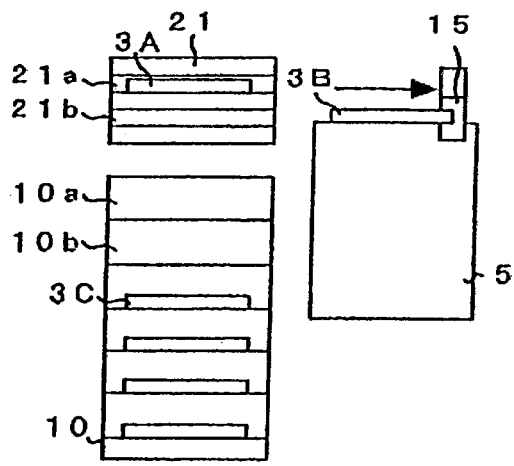
FIGS. 5A through 5H show the steps of operation of the wafer ring supplying and returning apparatus, these steps being a continuation of the step of FIG. 4H.

Then, as seen from FIG. 5A, the wafer chucking member 15 is moved to the right (or in the opposite direction from the buffer sections 21) (step S22). When the wafer ring 3B has been moved to a specified position on the jig holder 5, the wafer chucking member 15 opens; and then the wafer chucking member 15 is moved to the retracted position (step S23). As a result, the wafer ring 3B is placed in the jig holder 5 as shown in FIG. 5B.

Figure 5B:
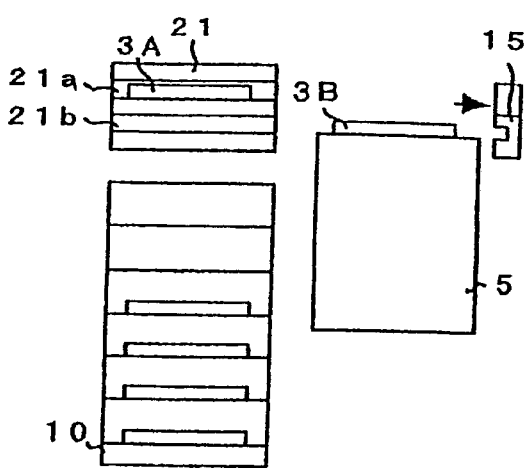
Figure 5C:
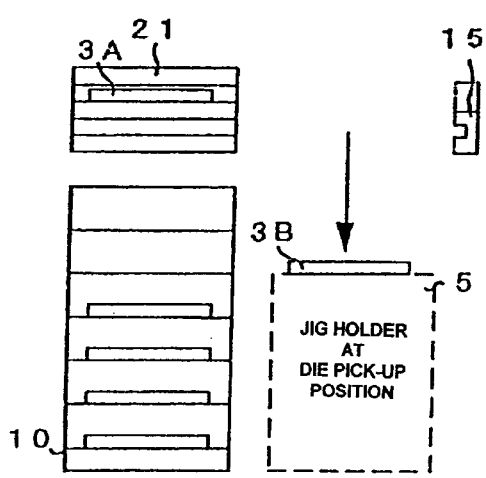

As shown in FIG. 5C, the jig holder 5 is next lowered, and the wafer ring 3B is stretched and positioned by the stretching device of the jig holder 5. Then, the XY table 6 (see FIG. 1) is driven so that the jig holder 5 is moved to the die pick-up position (step S24). Further, the dies 4a on the wafer ring 3B are picked up one at a time by the bonding apparatus 7 and are bonded to the lead frame 1 (step S25).

The processes shown in FIGS. 5A through 5C (step S22 through step S24) are the same as the processes shown in FIGS. 4C through 4E (step S13 through step S15).

During the bonding of the dies 4a of the wafer ring 3B, an operation that causes the wafer sheet on the wafer ring 3A to contract and causes the wafer ring 3A to be accommodated in the original accommodating section 10a of the magazine 10 is performed by the processes shown in FIGS. 5D through 5H.

Figure 5D:
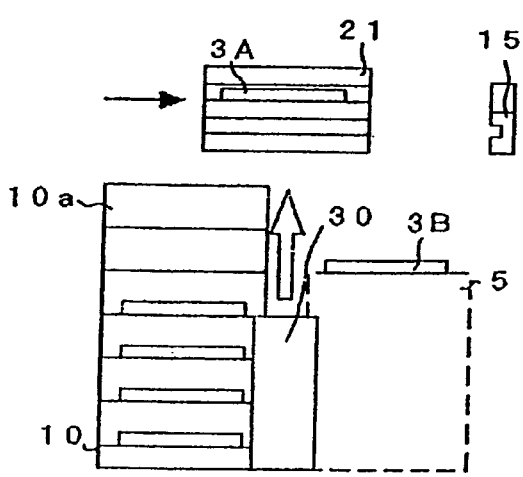

More specifically, as shown in FIG. 5D, the buffer sections 21 are advanced and moved to the heating position, so that the wafer sheet on the wafer ring 3A is heated by the hot air draft caused by the drier 30 (step S26).

Figure 5E:
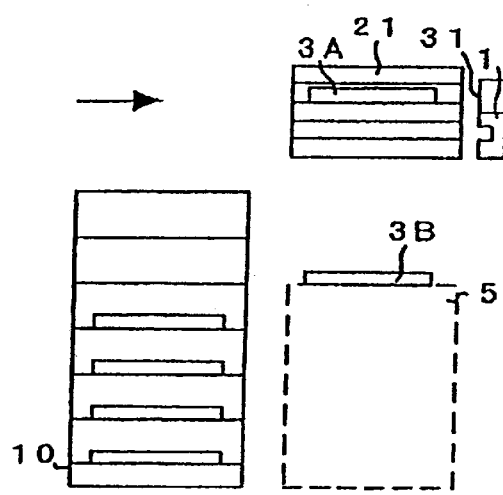

Then, as shown in FIG. 5E, the buffer sections 21 are moved to the right (or in the opposite direction from the magazine 10), so that the buffer sections 21 are separated from the area above the magazine 10 (step S27).

Figure 5F:
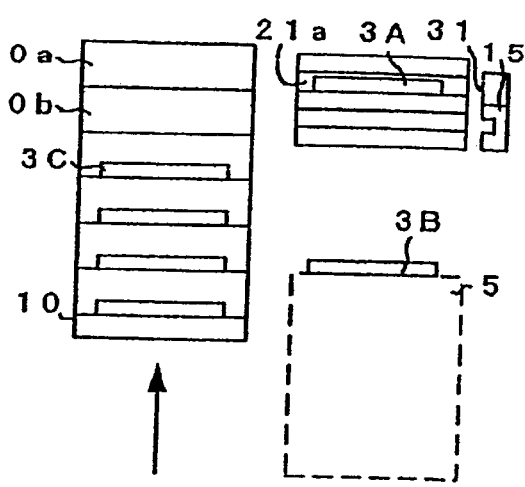

As shown in FIG. 5F, the magazine 10 is next raised so that the accommodating section 10a of the magazine 10 is moved to the accommodating position that corresponds to the wafer ring 3A (step S28).

Figure 5G:
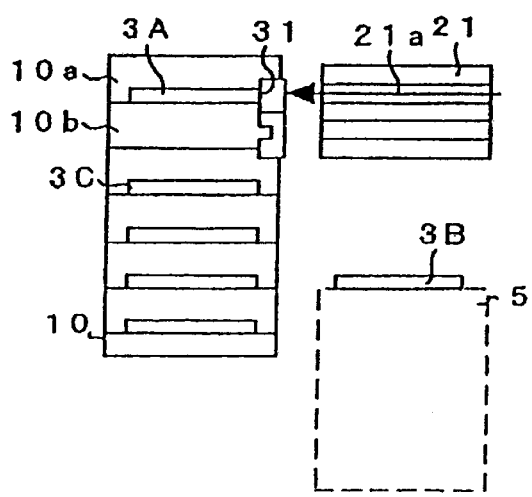

Furthermore, as shown in FIG. 5G, the wafer chucking member 15 is moved to the left (or toward the magazine 10) and positioned in front of the magazine 10. Then, the wafer ring 3A is pushed by the wafer pushing member 31 so that the wafer ring 3A is accommodated in the accommodating section 10a of the magazine 10 (step S29).

Figure 5H:
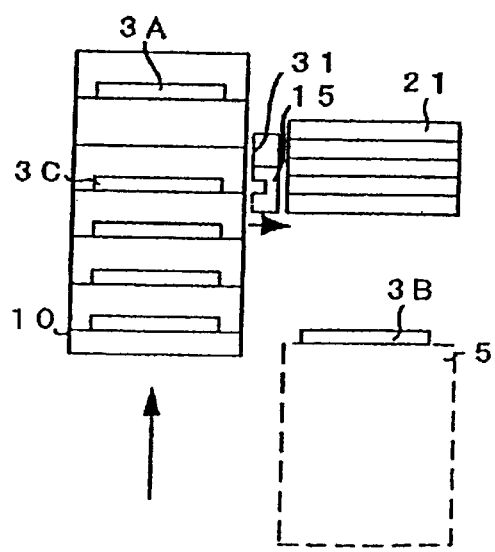

Next, a judgement is made as to whether or not any wafer rings 3 are present in the magazine 10 (step S30). When wafer rings 3 are in the magazine 10, the magazine 10 is raised to a supply position so that the wafer ring 3c is located so as to correspond to the wafer chucking member 15 as shown in FIG. 5H (step S3). Then, the process shifts to step S5 shown in FIG. 6 (from ② in FIG. 7 to ② in FIG. 6), and the above-described processes of step S5 and the following steps are performed. When no wafer rings 3 are present in the magazine 10, then the magazine 10 is replaced (step S32). The process shifts to step S1 in FIG. 6 (from ③ in FIG. 7 to ③ in FIG. 6), and the above-described processes of step S5 and the following steps are executed.

In the above embodiment, the upper wafer supporting grooves 21a are used for supporting the used wafer rings 3, and the lower wafer supporting grooves 21b for supporting the unused wafer rings 3 (wafer rings from which dies have not been removed or picked up yet). It is also possible to use the upper wafer supporting grooves 21a for supporting unused wafer rings 3 and to use the lower wafer supporting grooves 21b for used wafer rings 3. In such a case, the wafer chucking member 15 is caused to face the upper wafer ring supporting grooves 21 a, and the wafer pushing member 31 is caused to face the lower wafer supporting grooves 21b.

As seen from the above, in the present invention, the wafer pushing member 31 and the buffer mechanism 20 that has buffer sections 21 are additionally provided to the wafer transfer mechanism 11 and the elevator that raises and lowers the magazine 10 of a conventional wafer ring supplying and returning apparatus 10. Accordingly, the wafer ring supplying and returning apparatus can be greatly simplified, and the cost and size of the apparatus can be reduced.

In the present invention, the process to support the unused wafer rings 3 inside the magazine 10 on the buffer sections 21 is accomplished by advancing the buffer sections 21 (FIG. 3B), raising the magazine 10 (FIG. 3C), advancing and retracting the wafer chucking member 15 and wafer pushing member 31 (FIGS. 3D and 3E), and retracting the buffer sections 21 (FIG. 3H).

Furthermore, the process to transfer the used wafer rings 3 held in the jig holder 5 to the buffer sections 21 is accomplished by raising the jig holder 5 that has been moved to the wafer ring exchange position (FIG. 4F) and advancing the buffer sections 21 and wafer pushing member 31 (FIG. 4G). Also, the process to transfer unused wafer rings in the buffer sections 21 to the jig holder 5 is accomplished by retracting the wafer chucking member 15 and wafer pushing member 31 after the operation shown in FIG. 4H and FIGS. 5A and 5B.

Furthermore, the process to cause the wafer sheets on the used wafer rings 3 to contract and cause such used wafer rings 3 to accommodate in the empty accommodating sections of the magazine 10 is accomplished by advancing the buffer sections 21 to a point above the drier 30 (FIGS. 5D and 5E), raising the magazine 10 (FIG. 5F), and advancing the wafer chucking member 15 and wafer pushing member 31 (FIG. 5G).

Thus, since the respective processes are performed by a combination of the operations of a few mechanism elements, i.e., the buffer sections 21, wafer chucking member 15, wafer pushing member 31, magazine 10 and jig holder 5, the control system of the apparatus is simplified.

As seen from the above, the wafer ring supplying and returning apparatus of the present invention is comprised of a buffer mechanism (that has buffer sections in which two supporting grooves (upper and lower wafer supporting grooves) for supporting the wafer rings are formed) and a wafer pushing member (that pushes used wafer rings into the wafer supporting grooves) in addition to the wafer transfer mechanism and elevator that raises and lowers the magazine of a conventional wafer ring supplying and returning apparatus. Accordingly, the apparatus is greatly simplified, and the cost and size of the apparatus can be reduced.

Furthermore, in the present invention, the respective processes of: supporting unused wafer rings from the magazine in one of the wafer supporting grooves of the buffer sections, supporting used wafer rings held by the jig holder in another one of the wafer supporting grooves of the buffer sections, causing the unused wafer rings in the buffer sections to be held by the jig holder, and putting the used wafer rings from the buffer sections in empty accommodating sections of the magazine after the wafer sheets have been contracted, are accomplished by combinations of the movements of the above-described mechanism and constituting members. Accordingly, the control system is simple in structure.

What is claimed is:

1. A wafer ring supplying and returning apparatus comprising:
   a magazine which is carried on an elevator and raised and lowered, said magazine accommodating wafer rings at a fixed pitch,
   a jig holder which holds said wafer rings and being movable between a wafer ring exchange position in front of said magazine and a die pick-up position,
   a drier which is disposed near a front of said magazine so as to blows a hot air draft upward,
   a buffer mechanism which includes buffer sections in which two wafer supporting grooves that support said wafer rings are provided vertically, said buffer mechanism being caused to move to above and to a front of said magazine, and
   a wafer transfer mechanism which includes a wafer chucking member and a wafer pushing member, said wafer chucking member being disposed in a position corresponding to one of said two wafer supporting grooves and chucking and conveying said wafer rings, and said wafer pushing member being disposed in a position corresponding to another one of said two wafer supporting grooves and pushing said wafer rings, wherein
      when said jig holder has moved to said die pick-up position, an unused wafer ring inside said magazine is chucked by said wafer chucking member, removed from said magazine and supported in said one of said two wafer supporting grooves of said buffer sections,
      when said jig holder has moved to said wafer ring exchange position, a used wafer ring held in said jig holder is pushed by said wafer pushing member and supported in said another one of said two wafer supporting grooves of said buffer sections, and said unused wafer ring inside said buffer sections is chucked by said wafer chucking member and held in said jig holder, and
      when said jig holder has again moved to said die pick-up position, said buffer sections are moved to a point above said drier, and then said wafer chucking member chucks said used wafer ring inside said buffer sections and accommodates said used wafer ring in an empty accommodating section of said magazine.

* * * * *